United States Patent
Koch et al.

(10) Patent No.: US 7,940,144 B2
(45) Date of Patent: May 10, 2011

(54) SUBSTRATE WITH EMBEDDED SIGNAL LINE AND GROUND PLANES WITH A SLOT THEREIN

(75) Inventors: Robert Koch, Munich (DE); Maximilian Pitschi, Rottach-Egern (DE); Juergen Kiwitt, Munich (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/412,150

(22) Filed: Mar. 26, 2009

(65) Prior Publication Data

US 2009/0278630 A1    Nov. 12, 2009

Related U.S. Application Data

(63) Continuation of application No. PCT/DE2007/001778, filed on Oct. 4, 2007.

(30) Foreign Application Priority Data

Oct. 6, 2006   (DE) .......................... 10 2006 047 427

(51) Int. Cl.
*H01P 5/02* (2006.01)
*H01P 3/08* (2006.01)
(52) U.S. Cl. .......................................... 333/33; 333/238
(58) Field of Classification Search ................... 333/33, 333/238, 246
See application file for complete search history.

(56) References Cited

U.S. PATENT DOCUMENTS

| | | | |
|---|---|---|---|
| 3,961,296 A | 6/1976 | Wiggenhorn | |
| 5,334,800 A * | 8/1994 | Kenney | 174/250 |
| 5,675,299 A | 10/1997 | Suski | |
| 5,757,252 A | 5/1998 | Cho et al. | |
| 6,066,598 A | 5/2000 | Ishikawa et al. | |
| 6,144,268 A | 11/2000 | Matsui et al. | |
| 6,285,559 B1 * | 9/2001 | Fukiharu | 361/760 |
| 6,348,844 B1 * | 2/2002 | Albinsson et al. | 333/33 |
| 6,356,245 B2 | 3/2002 | Metzen et al. | |
| 6,856,210 B2 | 2/2005 | Zhu et al. | |
| 7,202,758 B2 * | 4/2007 | Hsu | 333/33 |
| 2002/0084876 A1 | 7/2002 | Wright et al. | |
| 2005/0083147 A1 * | 4/2005 | Barr | 333/33 |
| 2005/0201072 A1 | 9/2005 | He et al. | |

FOREIGN PATENT DOCUMENTS

| | | |
|---|---|---|
| DE | 24 44 228 | 3/1976 |
| DE | 42 40 104 A1 | 6/1994 |
| DE | 698 28 249 T2 | 12/2005 |
| EP | 1 041 665 A1 | 10/2000 |
| EP | 0 735 606 B1 | 1/2002 |

OTHER PUBLICATIONS

Koch, R. D., et al., "Design of Test Modules for the Characterization of SAW Duplexer Inserts by Measurement," 2006 IEEE Ultrasonics Sympoisum, 2006, pp. 1065-1068, XP-031076411, IEEE.

* cited by examiner

*Primary Examiner* — Benny Lee
(74) *Attorney, Agent, or Firm* — Slater & Matsil, L.L.P.

(57) ABSTRACT

A substrate with an HF-compatible line arranged in this substrate will be proposed that is formed similar to a tri-plate strip line in which, however, at least one of the ground planes has a slot that follows the profile of the signal line arranged between two ground planes. With the aid of this slot, the capacitive constant of the line can be lowered and thus the impedance of the line can be increased.

13 Claims, 4 Drawing Sheets

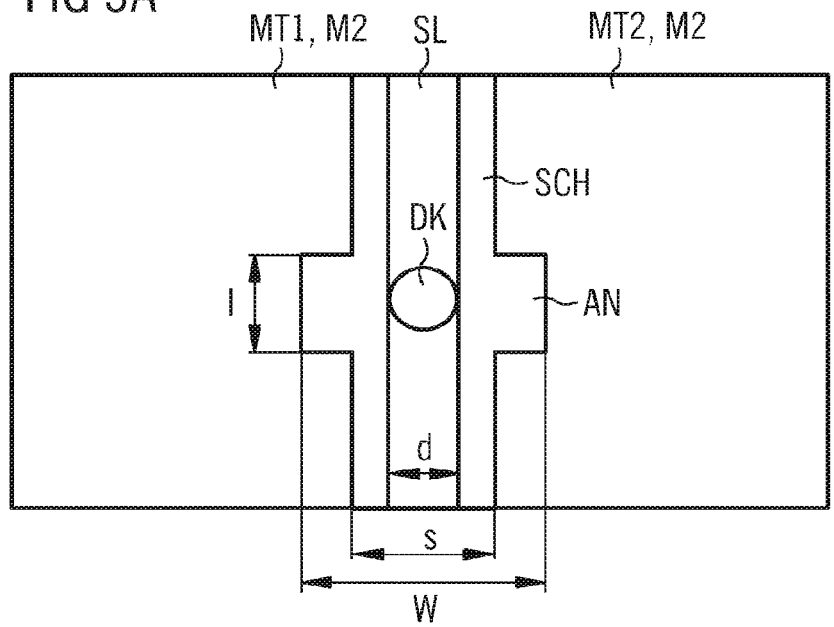
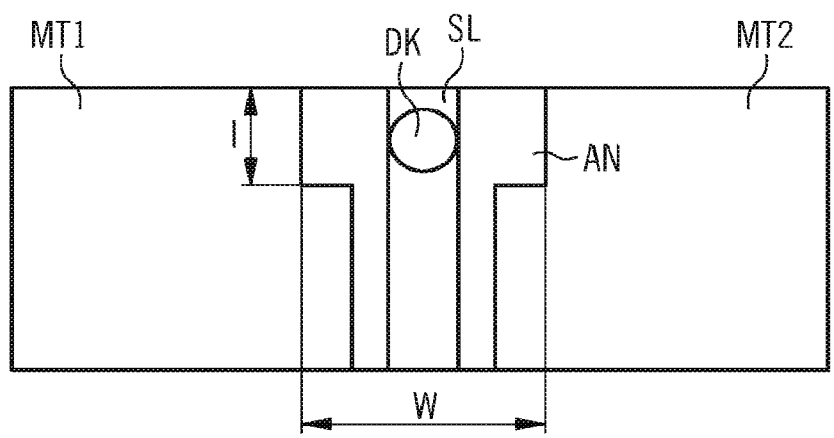
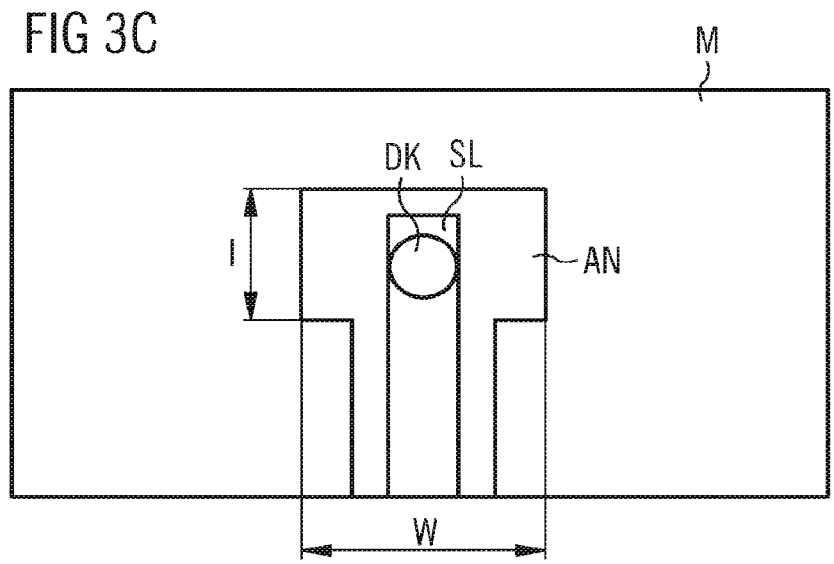

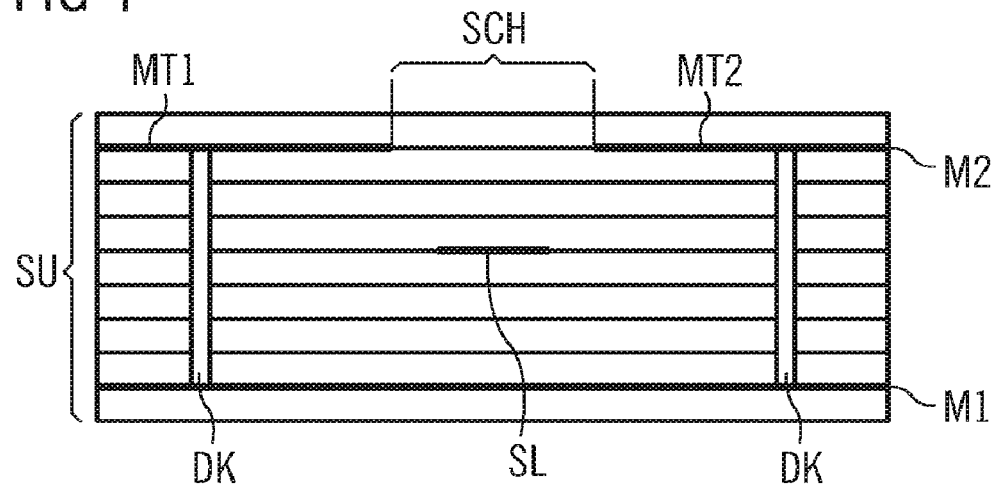
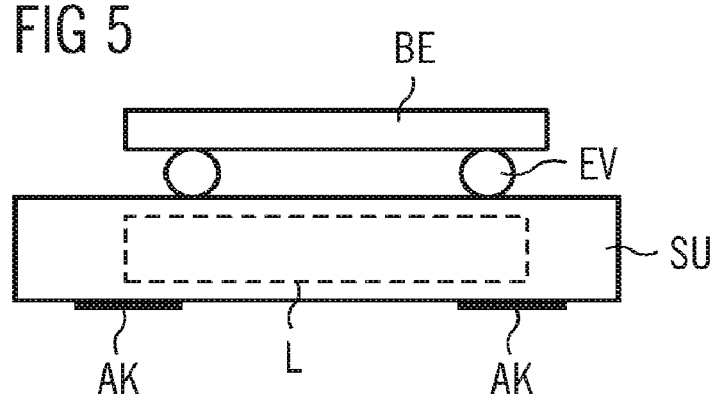
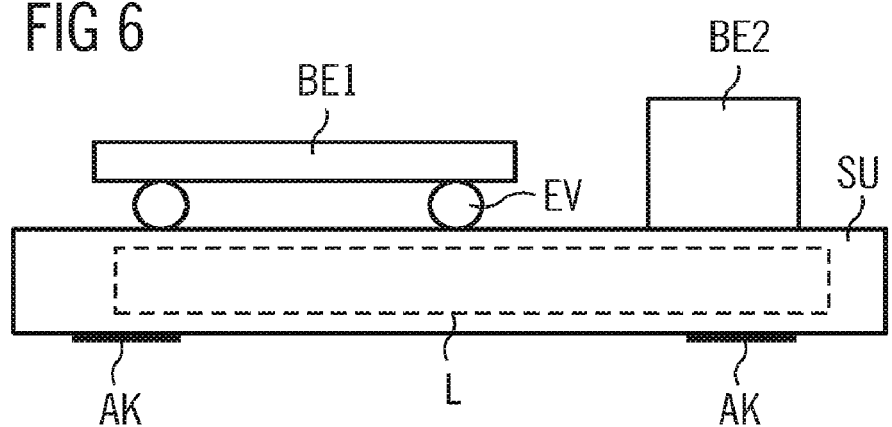

SUBSTRATE WITH EMBEDDED SIGNAL LINE AND GROUND PLANES WITH A SLOT THEREIN

This application is a continuation of co-pending International Application No. PCT/DE2007/001778, filed Oct. 4, 2007, which designated the United States and was not published in English, and which claims priority to German Application No. 10 2006 047 427.9 filed Oct. 6, 2006, both of which applications are incorporated herein by reference.

BACKGROUND

When operating at high frequencies, normal track conductors are replaced with strip lines, in order to ensure the necessary isolation. Such a strip line includes at least one strip-shaped signal conductor and at least one ground plane, with the signal conductor running at a distance to the ground plane. So-called symmetric strip lines in which the signal conductor is arranged between two ground planes are also possible. The strip lines are advantageously arranged in multiple-layer substrates that each have several dielectric layers with metallization planes arranged in between. Ground planes and signal conductors are each realized in different metallization planes arranged one above the other.

The impedance of each strip line is determined by a capacitive and an inductive transmission-line constant. The impedance of a strip line is essentially a function of the width of the strip-shaped signal conductor and the distance of the signal conductor from the closest ground plane, in addition to the permittivity of the substrate material. Lowering the capacitance and thus increasing the impedance is achieved when the width of the strip-shaped signal conductor is reduced and/or the distance of the signal conductor from the closest ground plane is increased.

In practice, the distance between the signal conductor and the closest ground plane is limited by the thickness of the multiple-layer substrate in which the strip line is realized, wherein, for a strip line constructed as a symmetric strip line, half the thickness of the substrate is available as the maximum signal conductor/ground plane distance. Also, the width of the signal conductor is limited by technology, because, for example, in ceramic multiple-layer components, the conductor width cannot be reduced arbitrarily.

If long strip lines or signal conductors are provided in a multiple-layer substrate, then the signal conductor/ground plane also determining the impedance of the strip line cannot be increased arbitrarily for substrate thicknesses that are common today for highly miniaturized components and modules. This has the consequence that the strip line in the substrate often cannot reach a desired standard impedance of, for example, 50 Ω. This problem is made worse if symmetric strip lines are used exclusively in the substrate because of better isolation.

SUMMARY OF THE INVENTION

In one aspect, the present invention provides a substrate with a line that is suitable for carrying HF signals, wherein a required impedance can be achieved with this line, without negatively affecting the isolation in an impermissible way.

A substrate with a multiple-layer construction and a line realized in this construction will be proposed in which a signal conductor is arranged between two ground planes. In contrast to known strip lines, however, at least one of the ground planes has a slot that follows the profile of the signal conductor.

In this way it is possible to reduce the capacitive constant of the line and thus to increase the impedance of the line to a desired value. The capacitance can be set in a simple way by means of the width of the slot. Here, the isolation level of the new line is only slightly reduced relative to a known symmetric strip line.

The slot is advantageously centered above the signal conductor, because a maximum effect is achieved in this way.

Advantageously, both the width of the signal conductor and also the slot width are constant across the entire profile and are merely interrupted by necessary feedthroughs. In this way the impedance of the line remains approximately constant across its entire length.

In the substrate, wiring can be realized that requires several lines or a line with several signal conductors or signal conductor sections. Advantageously, a slot that is arranged in an adjacent ground plane and that follows the signal conductor across at least a large portion of its entire length is allocated to each signal conductor or signal conductor section. It is also possible to provide a slot following the signal conductor in both ground planes. The widths of the slots in the first and second ground planes can be selected to be different.

Especially for substrates with several signal conductors arranged in the substrates, the ground plane provided with the slots can be divided into several ground sub-areas. For good isolation, a low-impedance ground is advantageous. For this purpose, all of the ground sub-areas separated from each other galvanically within a first ground plane can be connected to the second ground plane by means of feedthroughs. In this case it is advantageous when the second ground plane is a continuous metallization area that is interrupted, at most, by feedthroughs and that is not divided by slots into ground sub-areas. It is also possible, however, to connect ground sub-areas in the ground plane to each other and to bridge the slot with crossbars.

For realizing low-reflection feedthroughs, in the slotted ground plane, the slot is expanded at the position of the feedthrough into a recess through which the feedthrough is guided. The feedthrough connects the signal conductor to a metallization plane that is arranged above or below the line. This metallization plane can also be the surface or the bottom side of the substrate.

Here, the recess for the lead-in conductor of the feedthrough has a width w transverse to the profile of the line that influences the capacitance of this lead-in conductor. In contrast, the length 1 of the recess defines the inductive portion of the lead-in conductor. Through suitable selection of the length and width of the lead-in conductor, the impedance of the lead-in conductor is set to a desired value and is advantageously matched to the characteristic impedance of the line. According to standards, this impedance equals 50 Ω. Advantageously, the recess therefore has a rectangular opening or base surface, because in this way the desired impedance matching is more uniform and simpler. Cross-sectional surfaces with other shapes, however, are also possible.

In a multiple-layer component substrate or module substrate, the distance of the two ground planes is set to a maximum value under consideration of the free, available substrate volume not taken up by other metallization structures arranged in the substrate. Ideally, the two ground planes are arranged in metallization planes that are each set apart only by a dielectric layer from the top and bottom side of the substrate. In this way, it is possible to set a maximum distance of the signal conductor to the ground planes for a given substrate thickness.

The capacitance of the line lowered by the slot according to an embodiment of the invention in a ground plane can now also be varied such that the signal conductor is realized in a metallization plane that is not arranged centrally between the two ground planes. An asymmetric arrangement of the signal conductor relative to the distances to the ground planes can also be a result of optimization with which the substrate thickness is set to a minimum value, without here generating a capacitance constant that is too high for the line. This can then be a position that does not lie centrally with respect to the vertically defined distance of the two ground planes relative to each other and therefore closer to the slotted ground plane. The signal conductor, however, can also be arranged closer to the non-slotted ground plane.

The slot width can be selected larger or smaller than the strip width of the signal conductor, wherein, in all of the cases, the capacitance of the line relative to a non-slotted ground plane is reduced independently of the slot width. For a given slot width s and given width d of the signal conductor, the slot width s is advantageously set to a value between about 0.25 d and about 5 d.

An optimized line in a substrate advantageously has a profile of the signal conductor that is as linear as possible, wherein a desired conductor guide can be realized by straight sections of the signal conductor arranged at angles to each other or by round arcs. Advantageously, the number of angled sections between the signal conductor sections is minimized. In all of the cases, the slot also follows an angled profile of the signal conductor and is always centered on the signal conductor.

Advantageously, the substrate includes an LTCC ceramic (Low Temperature Co-fired Ceramic) in which the metallization planes and the signal conductors, ground planes, and other metallization structures realized therein are sintered together with the ceramic dielectric layers. The LTCC ceramic exhibits, in particular, low distortion, so that it allows the minimization of conductor track cross sections and consequently signal conductor widths, without raising the risk of interrupting the electrical conductor tracks by sintering distortion that is too great.

However, it is also possible to realize an embodiment of the invention with a multiple-layer substrate with dielectric layers including other ceramics, polymers, or laminates. Materials with the lowest possible relative permittivity of, for example, 10 and less are preferred for the dielectric layers.

The number of dielectric layers combined into a substrate is dependent on the desired number of metallization planes, on the optimum layer thickness of the dielectric layers defined by the technology in the layout of the substrate, and especially on the optimum layer thickness of the green films of the LTCC ceramic substrate, as well as on the desired or required distance between individual structure elements of the substrate and especially on the distance of the signal conductor from the ground planes.

A typical total substrate height is, for example, about 400 µm and can be realized, e.g., by the arrangement and sintering of eight dielectric LTCC layers one above the other each with about a 50-µm thickness. In today's LTCC technology, the width of the signal conductor typically equals at least about 75 µm, but can be further reduced with improved technologies.

Advantageously, the substrate according to an embodiment of the invention is provided as a component substrate for electrical components operating at high frequency. These are advantageously arranged on the substrate and electrically connected to the line. The substrate as a module substrate that is equipped with several components of which at least one operates in the HF range is also suitable. Components operating in the HF range can include active and passive components. Passive components can be filters or resonators in SAW technology (surface acoustic wave), BAW technology (bulk acoustic wave), or dielectric resonators and filters.

One component type that requires especially good isolation and that can be mounted in an especially advantageous way on the substrate according to an embodiment of the invention is a duplexer.

The substrate, however, can also include other metallization structures and passive components that are realized in this way and that can interact with the component or components on the surface of the substrate and that can involve complex wiring, in addition to the connection lines and especially the line constructed according to an embodiment of the invention. The substrate according to an embodiment of the invention is therefore used advantageously in modules like those used, in particular, in the front end of end devices of wireless mobile communications.

BRIEF DESCRIPTION OF THE DRAWINGS

Embodiments of the invention will be explained in greater detail below with reference to embodiments and the associated figures. The figures are used just for illustrating the invention and are therefore drawn only schematically and not true to scale. Therefore, neither absolute nor relative dimensional information is to be taken from the figures.

FIGS. 1A, 1B and 1C, collectively

FIGS. 3A, 3B and 3C, collectively FIG. 3, show a line with a recess in top view;

FIG. 4 shows a substrate with feedthroughs;

FIG. 5 shows a substrate with a component mounted on this substrate;

FIG. 6 shows a substrate according to the invention formed as a module substrate.

DETAILED DESCRIPTION OF THE INVENTION

Figure 1:
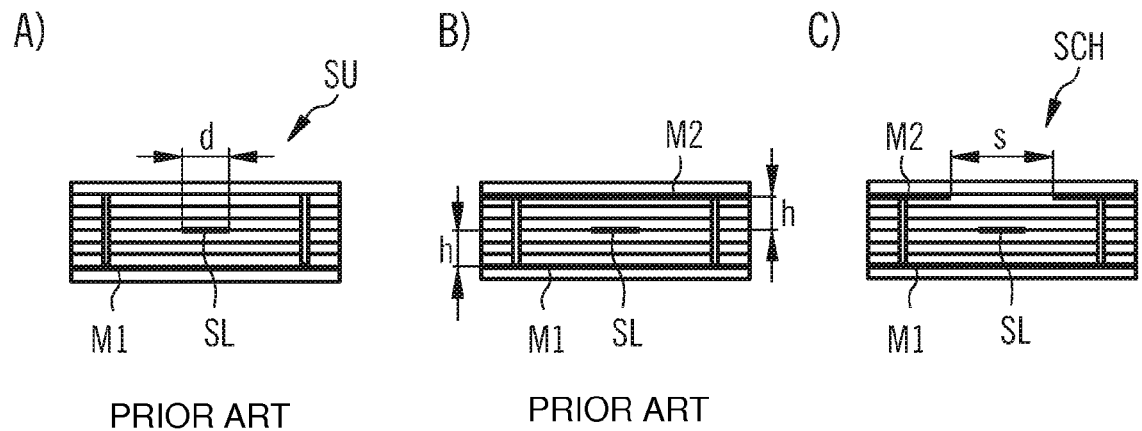
FIG. 1, show, in the schematic cross section, a line according to an embodiment of the invention in comparison to known strip lines.

FIG. 1C shows a substrate according to an embodiment of the invention with a line that is compared in FIG. 1A with a known, embedded micro-strip line and in FIG. 1B with a known symmetric strip line.

A known micro-strip line like in FIG. 1A includes a substrate SU (see label in FIG. 1B) with a multiple-layer layout made from several dielectric layers of which, as an example, eight are shown in the figure. A first ground plane M1 is provided in the region of a first surface of the substrate and separated from this substrate only by a dielectric layer. A signal conductor SL that has a distance h (see label in FIG. 1B) measured vertical to the substrate plane from the first metallization, which includes first ground plane M1, is structured centrally in the substrate in a second metallization plane. The distance h is measured from the top side of the first ground plane M1 to the bottom side of the signal line SL. The signal line SL is strip-shaped and has a width d.

In contrast, in FIG. 1B a symmetric strip line is shown that differs, compared with the embedded micro-strip line, by a second ground plane M2 arranged in the region of the top surface of the substrate SU see label in FIG. 1A and is separated from this top surface here in the figure only by a dielectric layer. The signal conductor SL is advantageously arranged centrally in the layer stack or in the multiple-layer substrate, so that the same distance h of the signal conductor is maintained both relative to the bottom first ground plane M1 and also to the top second ground plane M2.

Relative to the symmetric strip line, the line according to the embodiment from FIG. 1C differs by a slot SCH in the second ground plane M2. The slot is arranged as in FIG. 1C advantageously above the signal conductor SL and advantageously centered relative to this slot. The signal conductor can have the same or different distances to the first and second ground planes. The slot width s can be selected larger or smaller than the strip width d (see FIG. 1a) of the signal line. For the same layer configuration of the multiple-layer substrate with respect to the dielectric layers, the line according to an embodiment of the invention from FIG. 1C reaches approximately the impedance of the micro-strip line according to FIG. 1A and simultaneously approximately the isolation of the strip line according to FIG. 1B. The substrate according to an embodiment of the invention is thus improved in terms of isolation with respect to the micro-strip line according to FIG. 1A and improved in terms of isolation with respect to the symmetric strip line according to FIG. 1B.

Figure 2:
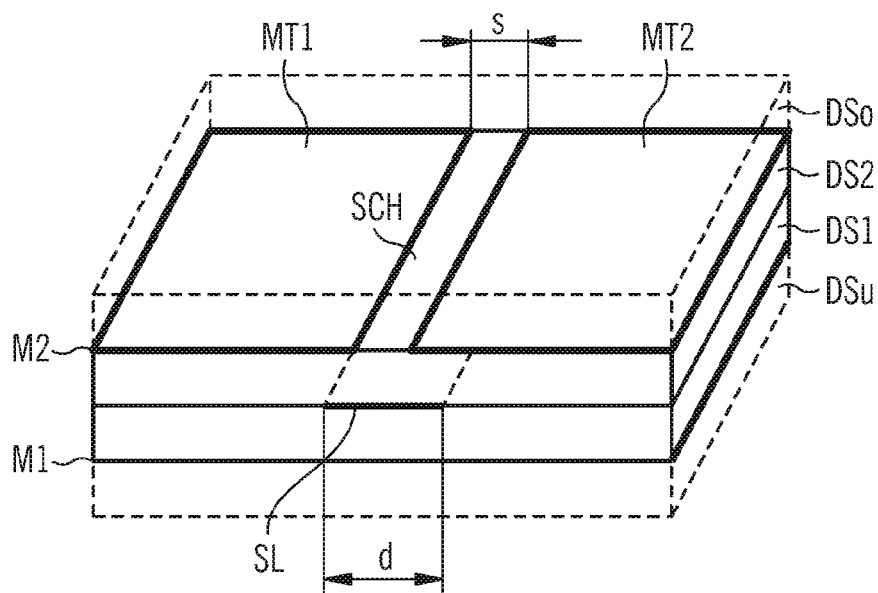
FIG. 2 shows the line in a perspective diagram.

FIG. 2 shows the substrate shown in cross section in FIG. 1C with a novel line in a perspective diagram. Here it is to be seen especially well that the strip-shaped signal conductor SL shown linearly here runs parallel to the slot in the second ground plane M2. In the shown cut-out of the substrate according to an embodiment of the invention that, in reality, has a larger and more complex structure, the slot follows the signal line across the entire length. It is advantageous when the slot follows the signal line across a large part of the strip length and especially across at least 80% of the entire strip length of the signal line. Advantageously, the slot is not interrupted by crossbars.

The width s of the slot can be varied in order to set the impedance of the line continuously to a desired value. In one example, the impedance of the line is matched to an impedance of 50 Ω. This is another advantage of the novel line relative to the known strip lines according to FIGS. 1A and 1B, because there the impedance was variable only by means of the distance h see label in FIG. 1B of the signal conductor to the ground planes and the width d of the signal conductor. The distance h can change, in turn, only in discrete steps that correspond to the thickness of the dielectric layers that are used, while the structure width d of the strip-shaped signal conductor has a lower limit set by the technology. The top ground plane M2 is divided by the slot SCH into a first ground sub-area MT1 and a second ground sub-area MT2. In one example, the width s of the slot and the width d of the strip-shaped signal conductor are related so that 0.25d<s<5d.

The thickness of the dielectric layer DS1 that is arranged between the signal line SL and the lower ground plane M1 and that can also be a layer region made from several layers can be equal to or different than the thickness of the second dielectric layers DS2 arranged between the signal line and the upper, second ground plane M2. Each dielectric layer region can also include a different number of dielectric layers. A top dielectric layer region $DS_o$ can also be arranged above the second ground plane M2, and a bottom dielectric layer region $DS_u$ can be arranged below the lower first ground plane M1, in order to electrically isolate the ground planes from the substrate surface.

FIG. 3A shows another configuration of a substrate according to an embodiment of the invention in top view of the top ground plane M2 divided by the slot SCH. At least in the shown region, the top ground plane is divided by the slot into a first ground sub-area MT1 and a second ground sub-area MT2 that can be without electrical connections within the ground plane. The signal conductor SL that is centered relative to the slot and that is shown here with a smaller width d than the slot width s runs parallel to the slot. At one position, the slot is widened into a recess AN with a width w as shown in FIGS. 3A-3C. The recess has a length 1 as shown in FIGS. 3A-3C. The shown rectangular recess, however, can also have some other cross-sectional shape or base area.

Advantageously, a feedthrough DK is arranged centered in the recess. The feedthrough DK connects the signal line SL electrically to a metallization plane arranged above the top ground plane M2. The width w and length 1 of the recess define the impedance of the feedthrough DK and therefore the reflection at this feedthrough. Not shown in the figure is the lower ground plane M1 that can be continuous. It is possible, however, to also provide in the lower ground plane a slot following the signal line in profile. Similarly, it is possible to provide recesses AN in the lower ground plane with or without a slot. With these recesses, the signal line SL can be connected to a metallization plane arranged underneath the lower first ground plane M1 and, in particular, to external contacts arranged on the bottom side of the substrate.

In FIGS. 3B and 3C, a variant of FIG. 3A is shown in which the feedthrough DK is arranged at one end of the signal conductor SL. In FIG. 3B, the signal conductor SL ends together with the metallization of the ground sub-areas MT1 and MT2, while in FIG. 3C the metallization of the ground plane M extends past the end of the signal conductor SL.

With reference to a schematic cross section, FIG. 4 shows the connection of the ground sub-areas MT1 and MT2 separated by the slot SCH to the first ground plane M1 by means of feedthroughs DK. For each ground sub-area MT1 and MT2 of the second ground plane M2, a plurality of feedthroughs DK can be provided, in order to connect the ground planes with sufficiently low impedance. FIG. 4 also illustrates substrate SU and signal conductor SL.

FIG. 5 shows a substrate according to an embodiment of the invention in schematic cross section on which an electrical component BE is mounted by means of suitable electrical connections EV. In the interior of the substrate SU, the line L constructed according to an embodiment of the invention and no longer shown in detail is arranged and electrically connected by means of at least one electrical connection EV to the component, as well as by means of a suitable connection to at least one of the external contacts AK mounted on the substrate on the bottom. At least one of the external contacts and at least one of the electrically conductive connections EV are each connected to a ground plane. The component BE is advantageously a component operating at high frequencies and especially a component operating with acoustic waves, for example, a BAW filter or a SAW filter. The latter can be mounted on the substrate SU as piezoelectric crystal plates or as bare dies by means of bump connections. Any other type of electrically conductive connection EV is also possible, however. BAW filters can also be electrically and mechanically connected to the substrate SU by means of bump connections.

With reference to a schematic cross section, FIG. 6 shows a substrate SU according to an embodiment of the invention that is used as a module substrate. A first component BE1 and a second component BE2 are mounted on the substrate SU and electrically connected to a line L constructed according to an embodiment of the invention in the interior of the substrate SU and to the external contacts AK on the bottom side of the substrate SU. Especially in this configuration as a module substrate, in the interior of the substrate SU, additional passive components, such as resistors, capacitors, and inductors can be formed by correspondingly structured metallization planes arranged with spacing one above the other and can be electrically connected to the components BE1 and BE2. FIG. 6 also illustrates electrical connections EV.

Figure 7:
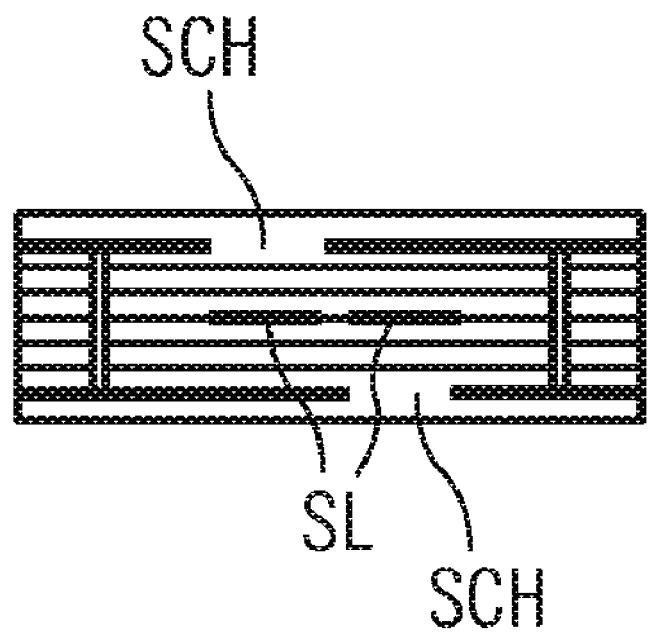
FIG. 7 shows another embodiment of the invention.

FIG. 7 shows an embodiment where a plurality of signal conductors SL are embedded in the substrate. A slot SCH is also formed in each of the ground planes. In the figure, slots SCH that each follow a profile of the signal conductors SL are provided in the first and second ground planes.

The invention is not limited to these embodiments shown and described in detail. A substrate according to an embodiment of the invention can be varied with respect to the number of dielectric layers, the number of metallization planes, the distances h of the signal conductor SL from the ground planes M, the ratio of strip width d of the signal line SL to the slot width s, with respect to the non-straight profile of the signal conductor or slot, and with respect to the number and type of components mounted on the substrate.

What is claimed is:

1. A substrate with a line, the substrate comprising:
   a plurality of dielectric layers; and
   a plurality of metallization planes arranged between the dielectric layers so that the substrate has a multiple layer construction;
   wherein the plurality of metallization planes include a line embedded in the substrate, the line including a strip-shaped signal conductor arranged between a first ground plane and a second ground plane and separated from each of the first and second ground planes by at least one of the dielectric layers,
   wherein one of the first and second ground planes has a slot therein that follows a profile of the signal conductor,
   wherein, in the slotted ground plane, the slot is expanded at one position into a recess, and
   wherein a feedthrough extends through the recess and connects the signal conductor electrically to a structure that is arranged at another of the plurality of metallization planes of the substrate.

2. The substrate according to claim 1, wherein the slot is centered above the signal conductor.

3. The substrate according to claim 1, wherein the slot follows the signal conductor across a large part of the entire length of the signal conductor.

4. The substrate according to claim 1, wherein the slot follows the signal conductor across more than 80% of the entire length of the signal conductor.

5. The substrate according to claim 1, wherein the strip-shaped signal conductor is one of a plurality of signal conductors that are embedded in the substrate.

6. The substrate according to claim 1, wherein the first ground plane is divided by the slot into sub-areas, wherein all of the sub-areas are connected to the second ground plane by feedthroughs.

7. The substrate according to claim 1, wherein the substrate comprises an LTCC ceramic.

8. The substrate according to claim 1, wherein the signal conductor has different distances measured vertical to a substrate plane from the first and second ground planes.

9. The substrate according to claim 1, wherein a width of the slot equals s and a width of the strip-shaped signal conductor equals d, where: $0.25d < s < 5d$.

10. The substrate according to claim 1, wherein the other of the first and second ground planes has a slot therein, and each slot follows a profile of the signal conductor are provided in the first and second ground planes.

11. The substrate according to claim 1, wherein an impedance of the line is matched to an impedance of 50 $\Omega$.

12. A device comprising:
    a substrate according to claim 1; and
    an electrical component operating at high frequency arranged on the substrate and electrically connected to the line.

13. The substrate according to claim 12, wherein the electrical component comprises the component operating with acoustic waves.

* * * * *

UNITED STATES PATENT AND TRADEMARK OFFICE
CERTIFICATE OF CORRECTION

| | | |
|---|---|---|
| PATENT NO. | : 7,940,144 B2 | |
| APPLICATION NO. | : 12/412150 | |
| DATED | : May 10, 2011 | |
| INVENTOR(S) | : Koch et al. | |

It is certified that error appears in the above-identified patent and that said Letters Patent is hereby corrected as shown below:

In Col. 8, line 29, claim 12, delete "a substrate" and insert --the substrate--.
In Col. 8, line 34, claim 13, delete "the component" and insert --a component--.

Signed and Sealed this
Second Day of August, 2011

David J. Kappos
*Director of the United States Patent and Trademark Office*